(12) United States Patent
Fu

(10) Patent No.: US 11,439,000 B2
(45) Date of Patent: Sep. 6, 2022

(54) STRUCTURAL ELEMENT FIXING STRUCTURE AND FIXING ELEMENT THEREOF

(71) Applicants: Inventec (Pudong) Technology Corporation, Shanghai (CN); INVENTEC CORPORATION, Taipei (TW)

(72) Inventor: Yung-Teng Fu, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 191 days.

(21) Appl. No.: 16/891,091

(22) Filed: Jun. 3, 2020

(65) Prior Publication Data
US 2021/0289613 A1   Sep. 16, 2021

(30) Foreign Application Priority Data
Mar. 13, 2020   (CN) .......................... 202010175132.3

(51) Int. Cl.
*H05K 1/02* (2006.01)
*F16M 13/00* (2006.01)

(52) U.S. Cl.
CPC ............. *H05K 1/02* (2013.01); *F16M 13/005* (2013.01); *H05K 2201/2036* (2013.01)

(58) Field of Classification Search
CPC ........ H05K 1/02; H05K 7/142; H05K 7/1402; H05K 7/1405
See application file for complete search history.

(56) References Cited

U.S. PATENT DOCUMENTS

| | | | | |
|---|---|---|---|---|
| 5,223,674 A | * | 6/1993 | Reznikov | H05K 7/142 361/759 |
| 10,989,239 B2 | * | 4/2021 | Rassam | F16B 5/0657 |
| 2008/0145186 A1 | * | 6/2008 | Jin | H05K 7/142 411/480 |
| 2011/0083880 A1 | * | 4/2011 | Shingin | H05K 7/142 174/250 |
| 2013/0141852 A1 | * | 6/2013 | Chen | H05K 7/142 361/679.4 |
| 2016/0374202 A1 | * | 12/2016 | Wang | H05K 1/144 |

* cited by examiner

*Primary Examiner* — Paresh Paghadal
(74) *Attorney, Agent, or Firm* — CKC & Partners Co., LLC

(57) ABSTRACT

A structural element fixing structure is provided. A flange of a first fixing element is connected with a side surface of a first shaft of the first fixing element. A first structure is fixed on the first fixing element. A second fixing element clamps the flange. An accommodating portion of the second fixing element is connected with a groove portion of the second fixing element. The accommodating portion has an accommodating space configured to accommodate the flange. A second shaft of the second fixing element is connected with the accommodating portion and is on a side of the accommodating portion facing away from the groove portion. A second structure is fixed on the second shaft of the second fixing element. The second fixing element separates the second structure and the first fixing element.

5 Claims, 10 Drawing Sheets

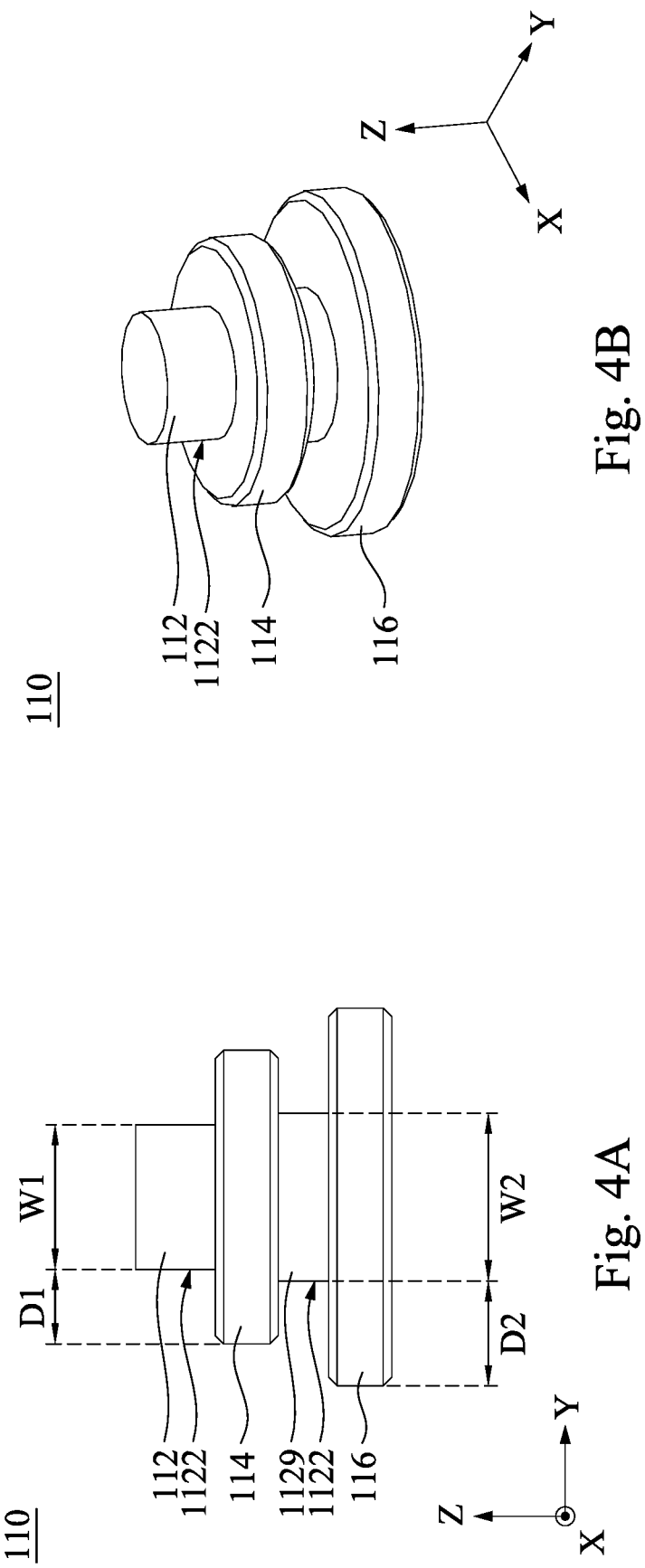

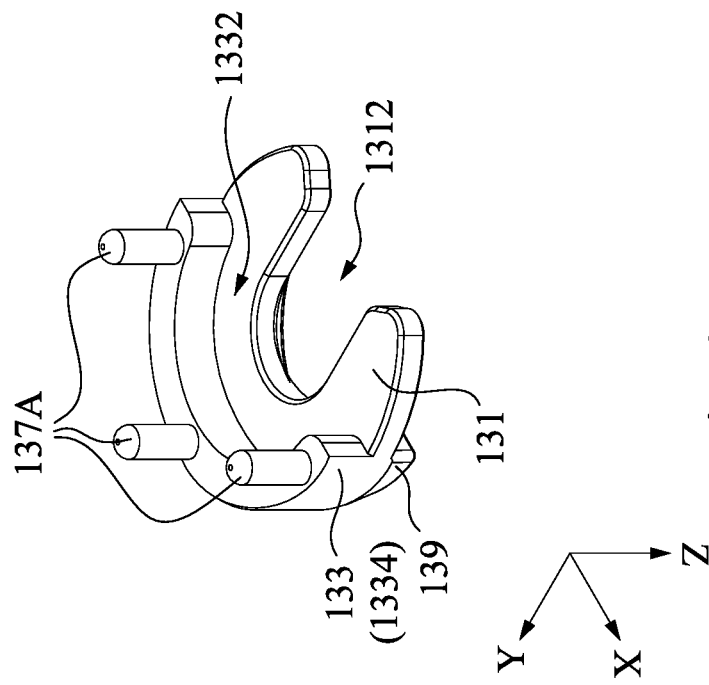
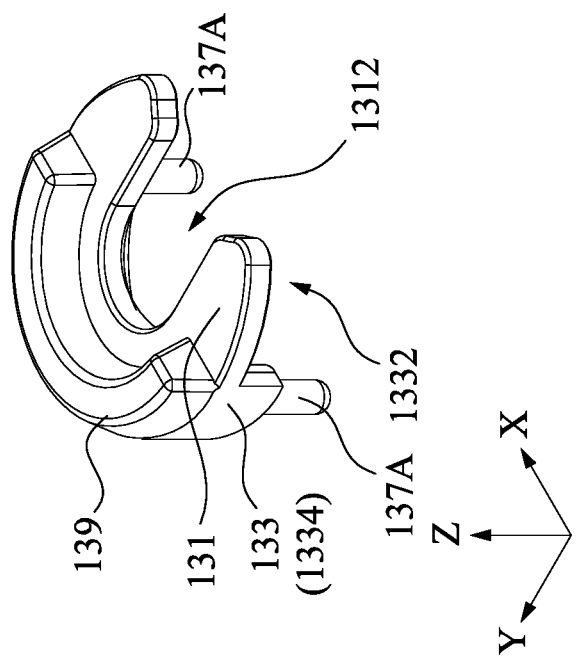

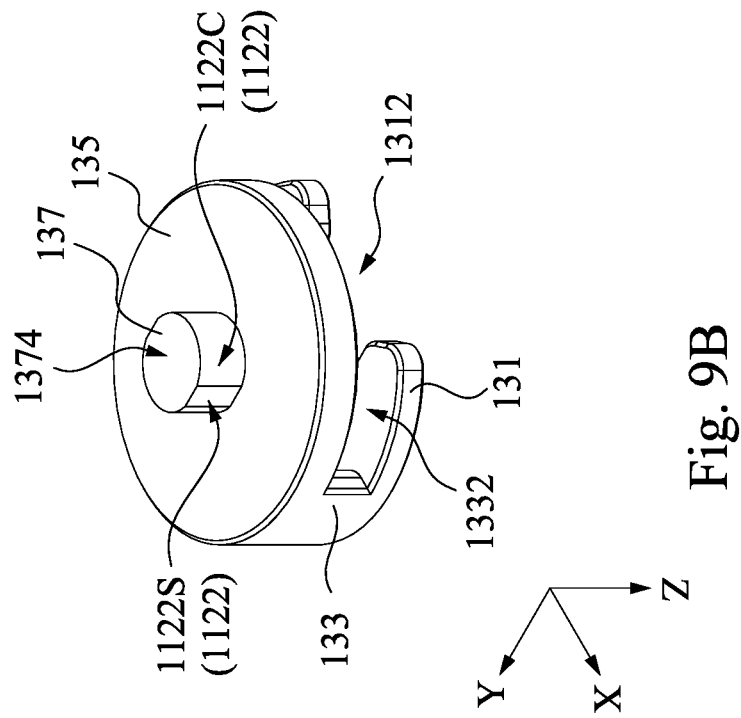
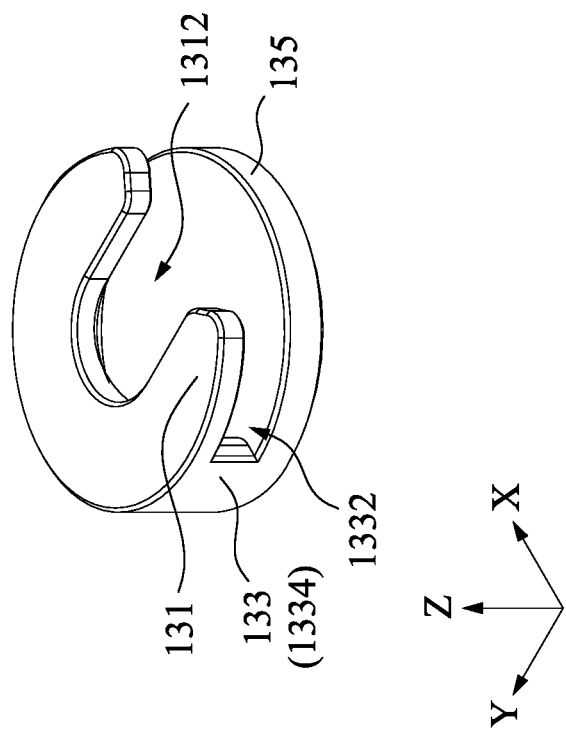
Fig. 9B
Fig. 9A

STRUCTURAL ELEMENT FIXING STRUCTURE AND FIXING ELEMENT THEREOF

RELATED APPLICATIONS

This application claims priority to China Application Serial Number 202010175132.3, filed Mar. 13, 2020, which is herein incorporated by reference.

BACKGROUND

Field of Invention

The present disclosure relates to a structural element fixing structure and a fixing element.

Description of Related Art

The statements in this section merely provide background information related to the present disclosure and do not necessarily constitute prior art.

Traditional ways of fixing a circuit board fixing element with screw holes thereon (i.e., a standoff) to a circuit board is to directly set the circuit board fixing element with screw holes thereon on an upper surface of the circuit board, so as to facilitate the screw holes to perform further combinations with other circuit boards, plates, or chassis. Other ways of fixing are to use a fixing element without screw holes thereon, such as a spool. For example, using two parallel flanges of the fixing element to clamp the circuit board, and then a shaft of the fixing element and a metal chassis are combined by stamping and riveting. When adjacent two circuit boards are fixed together, one of the circuit boards usually has a gourd-shaped hole to facilitate installation and disassembling of the circuit boards. Generally, opening portions of the gourd-shaped hole cannot be provided with circuits or parts. The ways of fixing as mentioned inevitably reduce space for circuit layout on the circuit board.

SUMMARY

With the progress of science and technology in recent years, demands for high system integration, multiplexing, and high-speed signals have increased the circuit wiring density. Layout spaces of circuit boards and components have a great influence on signal quality and product cost. In view of this, one purpose of the present disclosure is to propose structures which can reduce the space occupied by the fixing structure on the circuit board and possess a more flexible installation requirement, so as to further enhance space utilization rate of the circuit board. The circuit layout and positions for the placement of parts may be more flexible so as to meet requirements of layouts for circuits and components.

An object of the present disclosure is to provide a second fixing element to be disposed on a structural element (e.g., a circuit board), so as to provide a tool free and quick-release structure.

Another object of the present disclosure is that when the second fixing element is disposed on the circuit board, a surface mounted structure is adopted, which can free up more space for the circuit layout on the circuit board or reduce paths in which the circuit layout needs to bypass and avoid, which is very helpful for high-speed signals.

Still another object of the present disclosure is to provide a fixing element that allows the first circuit board to receive another structural element (e.g., another circuit board).

According to some embodiments of the present disclosure, a structural element fixing structure is provided. The structural element fixing structure includes a first fixing element, a first structural element, a second fixing element, and a second structural element. The first fixing element includes a first shaft and a flange. The flange connected with a side surface of the first shaft. The first structural element is fixed on the first fixing element. The second fixing element clamps the flange. The second fixing element includes a groove portion, an accommodating portion, and a second shaft. The accommodating portion is laterally connected with the groove portion. The accommodating portion has an accommodating space under the groove portion. The accommodating portion penetrates through a portion of the accommodating space and is configured to accommodate the flange. The second shaft is connected with the accommodating portion and is under the accommodating portion. The second structural element is fixed to and is under the second shaft of the second fixing element. The second fixing element separates the second structural element from the first fixing element.

In one or more embodiments of the present disclosure, the second structural element is a circuit board. The accommodating portion extends to form a base. The second shaft is on the base and forms a surface mounted structure with the second structural element.

In one or more embodiments of the present disclosure, the groove portion has a recessed space configured to accommodate the first shaft.

In one or more embodiments of the present disclosure, the second structural element is a circuit board, a number of the second shaft is plural, and positions where the plurality of the second shafts connect to the accommodating portion are under an outer edge area of the second fixing element.

In one or more embodiments of the present disclosure, the groove portion has a recessed space configured to accommodate the first shaft.

In one or more embodiments of the present disclosure, the first fixing element further comprises another flange connected with the side surface of the first shaft and spaced apart from the flange. The recessed space is configured to accommodate a portion of the first shaft between the flange and the another flange. The second fixing element further comprises an alignment portion on the groove portion and configured to abut against the first structural element.

According to some embodiments of the present disclosure, a structural element fixing structure is provided. The structural element fixing structure includes a first fixing element, a first structural element, a second fixing element, and a second structural element. The first fixing element includes a first shaft, a first flange, and a second flange. The first flange is connected with a side surface of the first shaft. The second flange is connected with the side surface of the first shaft and is spaced apart from the first flange. The first structural element fixed on the first fixing element. The second fixing element includes a groove portion, an accommodating portion, and a second shaft. The first flange and the second flange clamp the groove portion. The groove portion has a recessed space configured to accommodate a portion of the first shaft between the first flange and the second flange. The accommodating portion is laterally connected with the groove portion. The accommodating portion has an accommodating space under the groove portion. The accommodating portion penetrates through a portion of the accommodating space and is configured to accommodate the second flange. The second shaft is connected with and is under the accommodating portion. The second structural element is fixed under the second shaft of the second fixing element. The second fixing element separates the second structural element from the first fixing element, and the second structural element is a circuit board.

In one or more embodiments of the present disclosure, the accommodating portion extends to form a base. The second shaft is on the base. At least a portion of the accommodating portion and the second shaft form a surface mounted structure with the second structural element.

In one or more embodiments of the present disclosure, a number of the second shaft is plural, and positions where the plurality of the second shafts connect to the accommodating portion are under an outer edge area of the second fixing element.

According to some embodiments of the present disclosure, a fixing element configured to be fixed on a circuit board is provided. The fixing element includes a groove portion, an accommodating portion, and a second shaft. The groove portion has a recessed space. The accommodating portion is connected with the groove portion. The accommodating portion has an accommodating space. The second shaft is connected with and is under the accommodating portion. At least a portion of the accommodating portion and the second shaft are provided to be fixed on the circuit board and to form a surface mounted structure.

The embodiments of the present disclosure as mentioned at least reduce opening areas required by the circuit board and increase space for layout and setting parts on the first circuit board by fixing the circuit board with only one surface to the fixing element.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 4A is a schematic side view of the first fixing element according to some embodiments of the present disclosure.

FIG. 4B is a schematic stereogram of the first fixing element according to some embodiments of the present disclosure.

FIG. 8A is a schematic stereogram of a second fixing element according to some embodiments of the present disclosure.

FIG. 8B is a schematic stereogram of the second fixing element according to some embodiments of the present disclosure.

FIG. 9A is a schematic stereogram of a second fixing element according to some embodiments of the present disclosure.

FIG. 9B is a schematic stereogram of the second fixing element according to some embodiments of the present disclosure.

DETAILED DESCRIPTION

Figure 1:
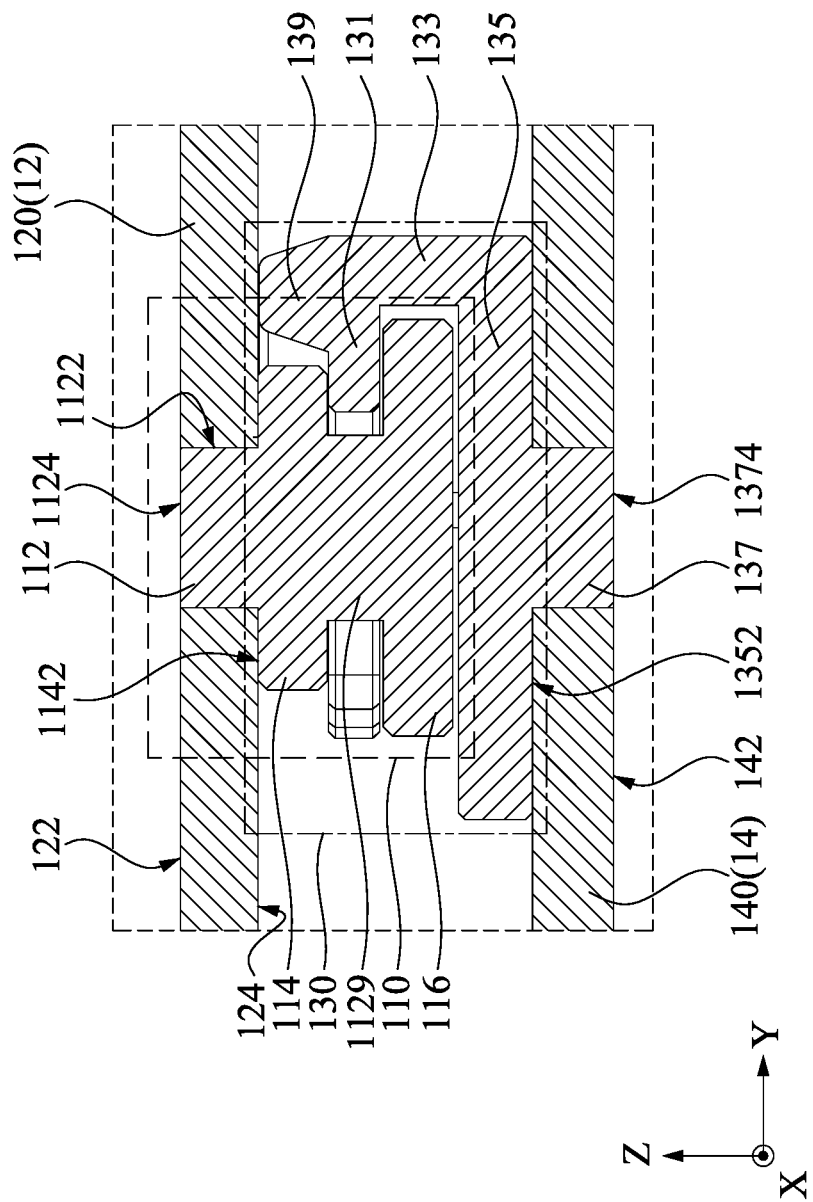
FIG. 1 is a schematic cross-sectional view of a structural element fixing structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

Figure 2A:
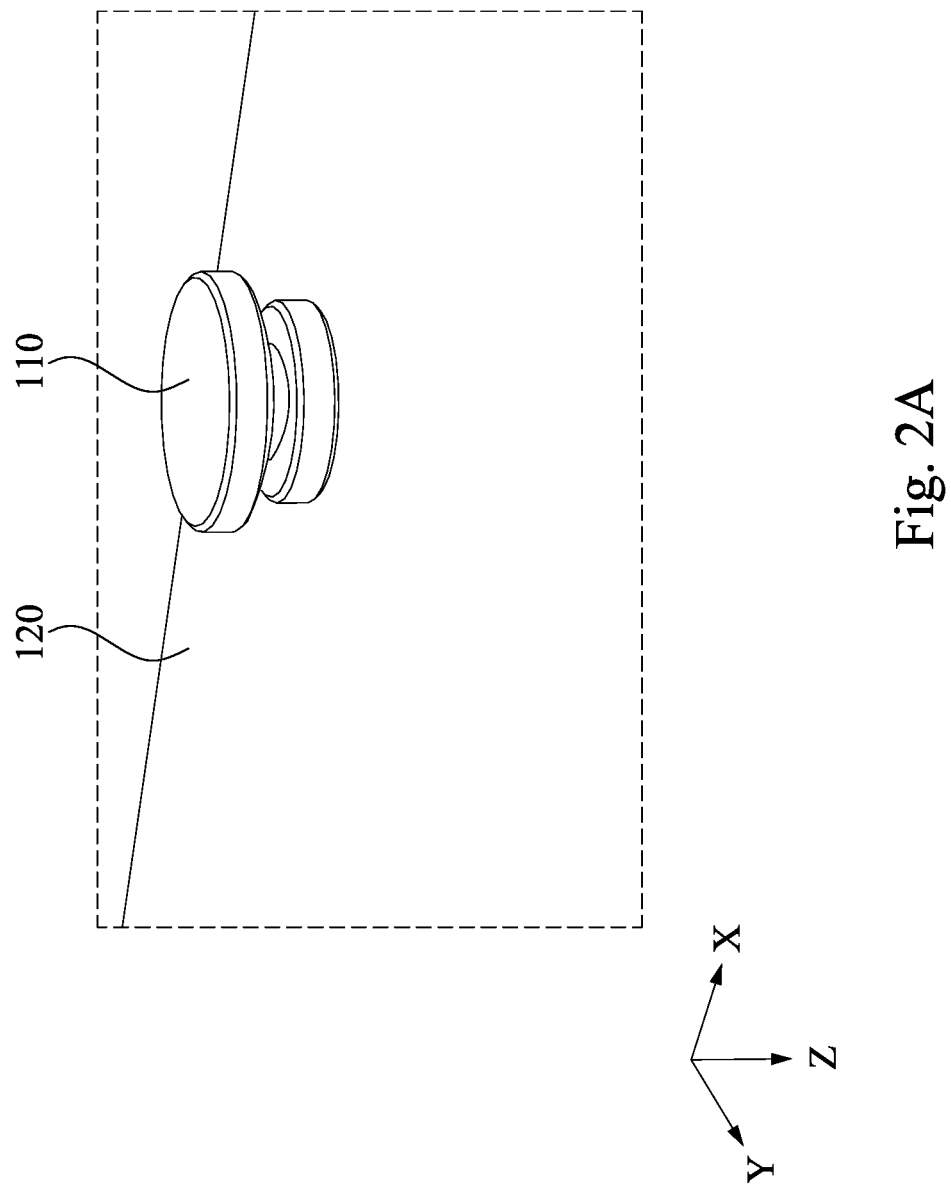
FIG. 2A is a schematic stereogram illustrating a first structural element fixed to a first fixing element according to some embodiments of the present disclosure.
Figure 2B:
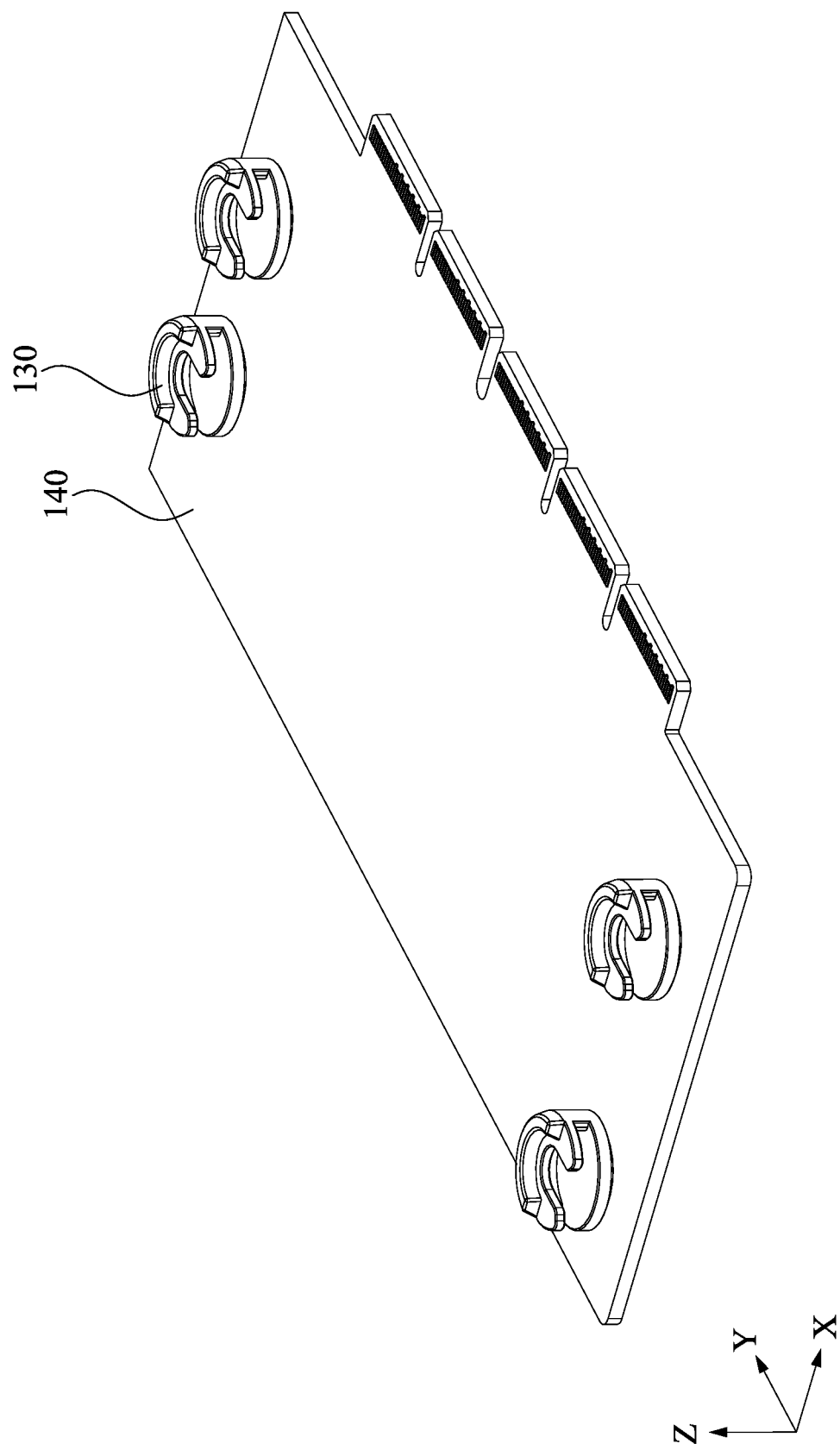
FIG. 2B is a schematic stereogram illustrating a second structural element fixed to a second fixing element according to some embodiments of the present disclosure.

Reference is made simultaneously to FIG. 1, FIG. 2A, and FIG. 2B. FIG. 1 is a schematic cross-sectional view of a structural element fixing structure 100 according to some embodiments of the present disclosure. FIG. 2A is a schematic stereogram illustrating a first structural element 12 fixed to a first fixing element 110 according to some embodiments of the present disclosure. FIG. 2B is a schematic stereogram illustrating a second structural element 14 fixed to a second fixing element 130 according to some embodiments of the present disclosure. The structural element fixing structure 100 includes a first fixing element 110, a first structural element 12, a second fixing element 130, and a second structural element 14. The first structural element 12 is, for example, a first circuit board 120, but should not be limited thereto. The second structural element 14 is, for example, a second circuit board 140, but should not be limited thereto. In the following descriptions of the drawings and embodiments, the first structural element 12 and the second structural element 14 are simplified to be represented by the first circuit board 120 and the second circuit board 140. This is for ease of description and reading, and should not be used to limit the scope of protection of the present disclosure.

The first circuit board 120 and the second circuit board 140 may be computer motherboards, or smaller adapter cards, solid state drives, etc. having specific functions, but should not limited thereto. The first fixing element 110 includes a first shaft 112, a first flange 114, and a second flange 116. The first flange 114 is connected with a side surface 1122 of the first shaft 112. The second flange 116 is connected with the side surface 1122 of the first shaft 112 and is spaced apart from the first flange 114. In some embodiments, the first flange 114 and the second flange 116 are annularly provided on the side surface 1122 of the first shaft 112. The first flange 114 and the second flange 116 are penetrated by the first shaft 112. The first flange 114 and the second flange 116 are in contact with the side surface 1122 of the first shaft 112. The first fixing element 110 may be made of metal, such as aluminum or carbon steel, but should not be limited thereto. The first fixing element 110 may be formed as a single piece, but should not be limited thereto. The first circuit board 120 is fixed on a surface 1142 of the first flange 114 away from the second flange 116. In some embodiments, the first circuit board 120 and the first fixing element 110 form a surface mounted structure by a surface-mount technology (SMT).

The second circuit board 140 is fixed on the second fixing element 130. In some embodiments, the second circuit board 140 and the second fixing element 130 form a surface mounted structure by the SMT. The second fixing element 130 separates the second circuit board 140 from the first fixing element 110. The second fixing element 130 is configured to fit and engage with the first fixing element 110. In some embodiments, the second fixing element 130 includes a groove portion 131, an accommodating portion 133, a base 135 in which the accommodating portion 133 and the base 135 extend to each other, and a second shaft 137. The groove portion 131 is configured to accommodate a portion 1129 of the first shaft 112 between the first flange 114 and the second flange 116. The second fixing element 130 may be made of metal, such as aluminum or carbon steel, but should not be limited thereto. The second fixing element 130 may be formed as a single piece, but should not be limited thereto. When the second fixing element 130 is clamped and engaged with the first fixing element 110, the groove portion 131 is between the first flange 114 and the second flange 116 of the first fixing element 110. The first flange 114 and the second flange 116 clamp the groove portion 131. The groove portion 131 is, for example, a U-shaped groove. A U-shaped opening is configured to accommodate the portion 1129 of the first shaft 112 during the clamping as mentioned, and a solid portion of the U-shaped groove may be configured to abut against the first flange 114 and/or the second flange 116. The accommodating portion 133 is connected with the groove portion 131, and is configured to accommodate the second flange 116. The base 135 is connected with the accommodating portion 133, and is configured to place the second flange 116. In some embodiments, at least a portion of the accommodating portion 133 and the second shaft 137 are provided to be fixed on the second circuit board 140 and to form a surface mounted structure.

Specifically, the solid portion of the accommodating portion 133 is connected with a portion of an outer edge area of the base 135, which can be regarded as that the portion of the outer edge area of the base 135 extends perpendicular to an extension direction of the base 135. Therefore, when the first fixing element 110 is clamped and engaged with the second fixing element 130, the second flange 116 can be regarded as being placed on the base 135, and the solid portion of the accommodating portion 133 can be configured as a position limiting structure against a side surface of the second flange 116. The second shaft 137 is connected with the base 135 and is on a side of the base 135 facing the second circuit board 140. In some embodiments, the second shaft 127 is in contact with the second circuit board 140. Specifically, one end 1374 of the second shaft 137 penetrates through the second circuit board 140 and is coplanar with a surface 142 of the second circuit board 140 facing away from the base 135 (or facing away from the first circuit board 120 when the engagement is completed). The base 135 is between the end 1374 and the accommodating portion 133 as mentioned. When the clamping is completed, the base 135 is also between said end 1374 and the second flange 116 as mentioned. In the "coplanar" embodiment as mentioned, since there is not any portion of the second fixing element 130 protruding out from the surface 142, the continuity of space for placing parts on the second circuit board 140 is better, and the arrangement of parts can be more flexible.

In some embodiments, after the first circuit board 120 and the first fixing element 110 together form a surface mounted structure, and after the second circuit board 140 and the second fixing element 130 together form a surface mounted structure, the first fixing element 110 and the second fixing element 130 are engaged with each other. In some embodiments similar to a structural relationship between the second fixing element 130 and the second circuit board 140, one end 1124 of the first shaft 112 penetrates through the first circuit board 120 and is coplanar with a surface 122 of the first circuit board 120 facing away from the first flange 114. The first flange 114 is between said end 1124 and the second flange 116. In the "coplanar" embodiment as mentioned, since there is not any portion of the first fixing element 110 protruding out from the surface 122, the continuity of space for placing parts on the first circuit board 120 is better, and the arrangement of parts can be more flexible.

Figure 3:
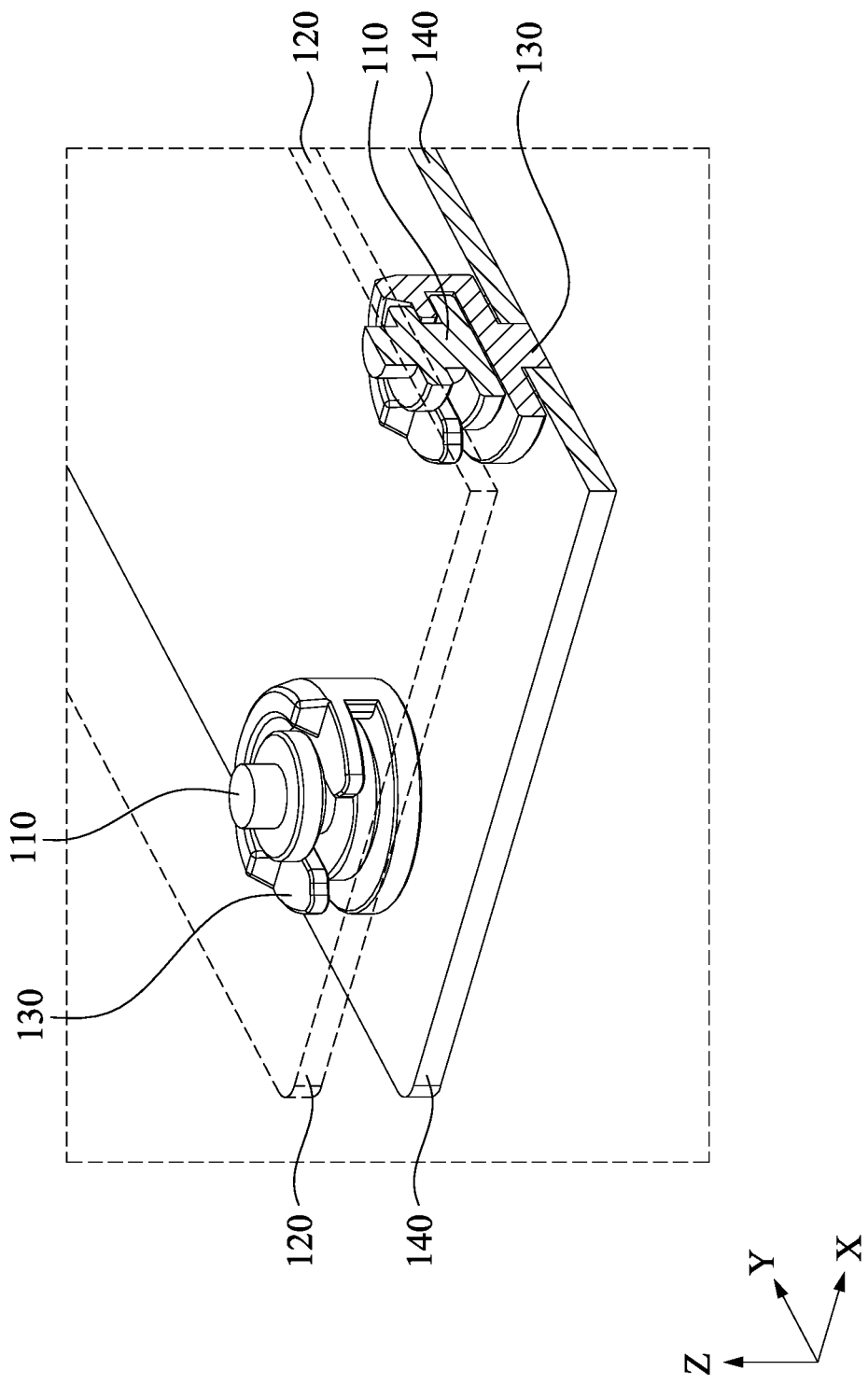
FIG. 3 is a stereoscopic perspective view and also a schematic cross-sectional view of the structural element fixing structure according to some embodiments of the present disclosure.

As mentioned before, the first circuit board 120 and the second circuit board 140 are respectively fixed (joined) with the first fixing element 110 and the second fixing element 130 by the SMT. Specifically, at the time of leaving the factory, the first circuit board 120 and the first fixing element 110 are already fixed together, and the second circuit board 140 and the second fixing element 130 are already fixed together. Then, a combination of the first circuit board 120 and the first fixing element 110 and a combination of the second circuit board 140 and the second fixing element 130 are manually engaged together via the first fixing element 110 and the second fixing element 130. Reference is made to FIG. 3. FIG. 3 is a stereoscopic perspective view and also a schematic cross-sectional view of the structural element fixing structure 100 according to some embodiments of the present disclosure. FIG. 3 shows a structural relationship between the first fixing element 110, the first circuit board 120, the second fixing element 130, and the second circuit board 140 in a clearer way. The cross-sectional view along Y-Z plane in FIG. 3 is the same as the angle of view in FIG. 1. In the above embodiments, the first circuit board 120 is fixed on the surface 1142 of the first flange 114 facing away from the second flange 116 by the SMT, and the second circuit board 140 is fixed on a surface 1352 of the base 135 facing away from the accommodating portion 133 by the SMT. The configuration makes these embodiments be able to free up more space for layout and setting parts on the first circuit board 120 and the second circuit board 140. The setting of larger area holes (e.g., gourd-shaped holes, but should not be limited thereto) on the first circuit board 120 and the second circuit board 140 can be omitted, thereby optimizing space utilization of the first circuit board 120 and the second circuit board 140.

In some embodiments, the second fixing element 130 further includes an alignment portion 139 (as referred to FIG. 1). The alignment portion 139 is on and connected with the groove portion 131, and is configured to abut against the first circuit board 120. The alignment portion 139 may be configured to abut against the first circuit board 120 during the assembly of the first circuit board 120 and the second circuit board 140, so that positions of the first fixing element 110 and the second fixing element 130 in Z direction are automatically aligned. After the abuttal, a user can directly translate the first fixing element 110 or the second fixing element 130 in a direction along X-Y plane to easily position and engage the first fixing element 110 and the second fixing element 130 so as to complete the assembly of the structural element fixing structure 100 as shown in FIG. 1.

Reference is made to FIG. 1, FIG. 4A, and FIG. 4B. FIG. 4A is a schematic side view of the first fixing element 110 according to some embodiments of the present disclosure. FIG. 4B is a schematic stereogram of the first fixing element 110 according to some embodiments of the present disclosure. The first fixing element 110 as shown in FIGS. 4A and 4B can be regarded as one example of the first fixing element 110 as shown in FIG. 1. The first shaft 112 as shown in FIGS. 4A and 4B is a cylinder, and the side surface 1122 is a cylindrical surface. In some embodiments, a height D2 of the second flange 116 relative to the side surface 1122 of the first shaft 112 (along an extension direction of X-Y plane) is greater than a height D1 of the first flange 114 relative to the side surface 1122 of the shaft 112. The content as mentioned can be referred to labels in FIG. 4A and also the first flange 114 and the second flange 116 as shown in FIGS. 1, 4A, and 4B. In such embodiments, since the second flange 116 protrudes more outward than the first flange 114 relative to the shaft 112, an area where the second flange 116 able to be in contact with the second fixing element 130 is increased, and the engagement is thus more stable. Therefore, it becomes more stable when the first circuit board 120 is installed on the second fixing element 130. Meanwhile, since an extent of protrusion of the first flange 114 is less than that of the second flange 116, an influence on space of circuit layout on a surface 124 of the first circuit board 120 which contacts the first flange 114 is thus reduced. Reference is made to FIG. 4A. In some other embodiments, a width W2 of the portion 1129 of the first shaft 112 between the first flange 114 and the second flange 116 is greater than a width W1 of other portions of the shaft 112. A direction of measurement of the widths W1 and W2 is the same as the extension direction of the heights D1, D2. Such embodiments can further increase the area where the second flange 116 is able to be in contact with the second fixing element 130 as mentioned, such that the engagement is more stable. The present disclosure certainly does not exclude embodiments in which the width W1 and the width W2 are the same.

Figure 5:
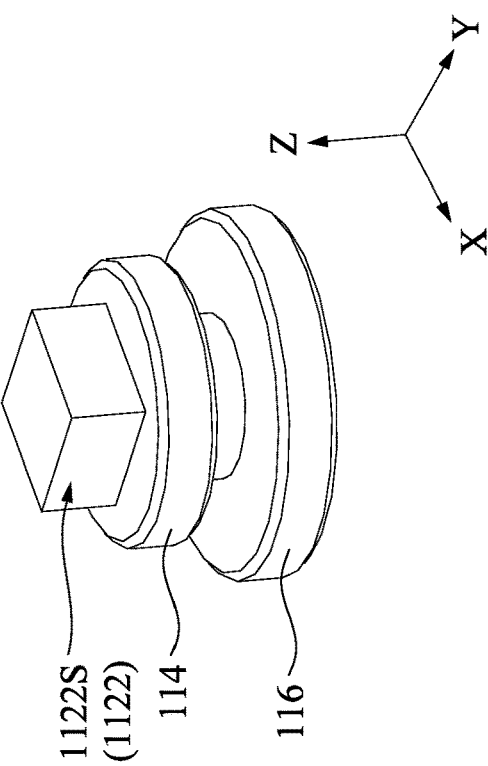
FIG. 5 is a schematic stereogram of a first fixing element according to some embodiments of the present disclosure.

Reference is made to FIG. 5. FIG. 5 is a schematic stereogram of a first fixing element 110A according to some embodiments of the present disclosure. The first fixing element 110A in FIG. 5 can be regarded as one variation of the first fixing element 110. In some embodiments, the side surface 1122 of the first shaft 112 has a stop surface 1122S. The stop surface 1122S may be a flat surface. The benefit of the side surface 1122 which includes the stop surface 1122S is that in a specific application, if a force suffered by the first circuit board 120 in said application is known in advance, a planar stop surface 1122S facing a direction of the suffered force may be provided according to said direction. Generally, the planar stop surface 1122S is more capable of resisting a force normal to the planar stop surface 1122S than the arc surface or the cylindrical surface of the first fixing element 110 as shown in FIGS. 4A and 4B. Therefore, the first circuit board 120, peripheral parts, and the circuit layout can be further protected from damage in specific applications.

Figure 6:
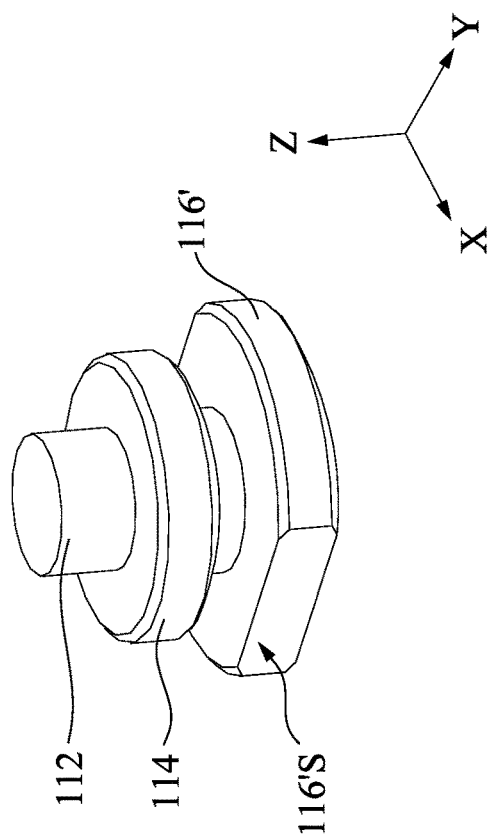
FIG. 6 is a schematic stereogram of a first fixing element according to some embodiments of the present disclosure.

Reference is made to FIG. 6. FIG. 6 is a schematic stereogram of the first fixing element 110B according to some embodiments of the present disclosure. The first fixing element 110B in FIG. 6 can be regarded as one variation of the first fixing element 110. In some embodiments, an outer edge of the second flange 116' is directional, which can be understood as non-circular, or that a lateral length of the second flange 116' measured in different extension directions on a plate surface (e.g., X-Y plane in FIGS. 1 and 2A) may be different. An angle of view as defined for said "non-circular" is an extension direction of the shaft 112 (i.e., Z direction in FIG. 6). For example, as illustrated by FIG. 6, a side surface 116'S of the second flange 116' has an edge angle or is a planar surface, which makes it easier for the first fixing element 110B to be installed within a relatively dense layout of parts. In this case, a shape of the solid portion of the accommodating portion 133 of the second fixing element 130 for contacting the side surface 116'S of the second flange 116' and/or a shape of the base 135 are also adjusted accordingly, which will not be elaborated herein. In some special cases, because of the way of placement of parts, only the second flange 116' extending along a specific direction or with a specific geometry is able to achieve an installation of the structural element fixing structure 100. Comparing to the second flange 116 (having a circular outer edge) of the first fixing element 110 as shown in FIG. 4B, the non-circular second flange 116' in cooperation with the accommodating portion 133 and the base 135 having corresponding shapes is more flexible in applications.

Figure 7B:
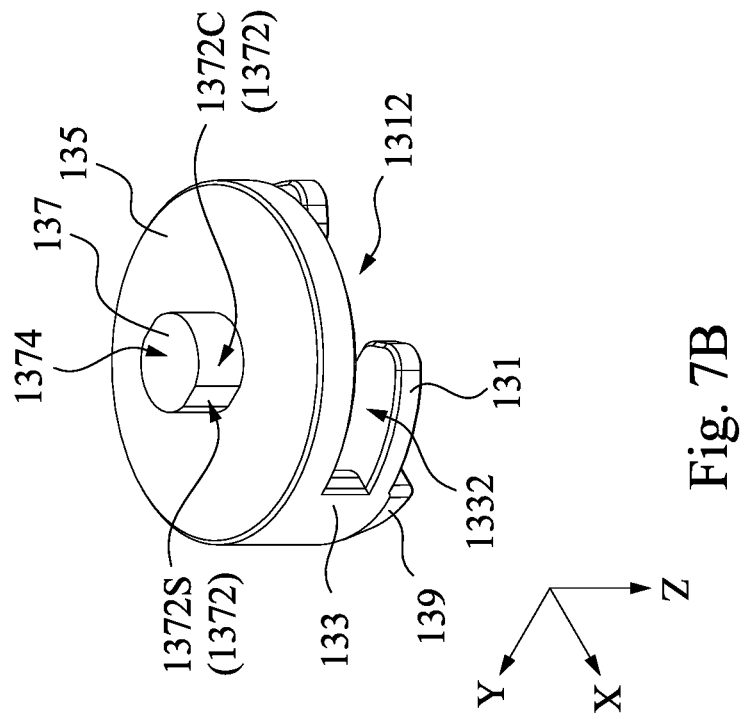
FIG. 7B is a schematic stereogram of the second fixing element according to some embodiments of the present disclosure.
Figure 7A:
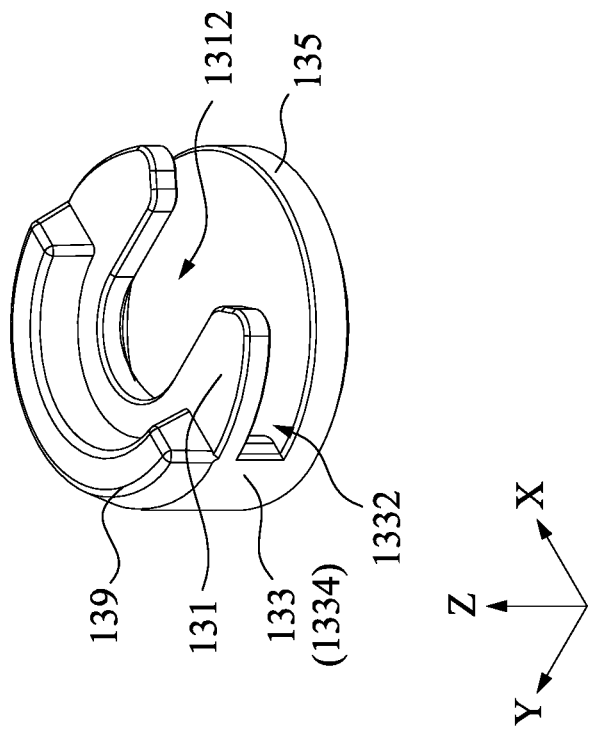
FIG. 7A is a schematic stereogram of the second fixing element according to some embodiments of the present disclosure.

Reference is made to FIG. 7A and FIG. 7B. FIG. 7A is a schematic stereogram of the second fixing element 130 according to some embodiments of the present disclosure. FIG. 7B is a schematic stereogram of the second fixing element 130 according to some embodiments of the present disclosure. An angle of view in FIG. 7B is a rotation of 180 degrees along Y axis as compared to that of an angle of view in FIG. 7A. The second fixing element 130 as shown in FIGS. 7A and 7B can be regarded as one example of the second fixing element 130 as shown in FIG. 1. In some embodiments, the groove portion 131 of the second fixing element 130 has a recessed space 1312. The U-shaped opening as mentioned can be regarded as a description or one example of the recessed space 1312. In some embodiments, the recessed space 1312 and the solid portion of the groove portion 131 are coplanar on X-Y plane. The accommodating portion 133 has an accommodating space 1332 and a connecting portion 1334. The connecting portion 1334 is connected with the groove portion 131. The connecting portion 1334 may be equivalent to the solid portion of the accommodating portion 133 as mentioned. In some embodiments, the accommodating space 1332 of the accommodating portion 133 and the connecting portion 1334 are coplanar on X-Y plane. The accommodating space 1332 and the recessed space 1312 are connected with (extended to) each other, and are respectively configured to accommodate the second flange 116 and the portion 1129 of the first shaft 112.

The base 135 is connected with the connecting portion 1334 of the accommodating portion 133. The connecting portion 1334 separates the groove portion 131 from the base 135. In some embodiments, a projection of the base 135 on the groove portion 131 is overlapped with the recessed space 1312, and a projection of the base 135 on the accommodating portion 133 is overlapped with the accommodating space 1332. After the second circuit board 140 is fixed to the second fixing element 130 by the SMT, the second circuit board 140 is fixed on the base 135 and the second shaft 137.

In the embodiments as shown in FIG. 7B, the side surface 1372 of the second shaft 137 has a circular arc surface 1372C and a stop surface 1372S connected with each other. The stop surface 1372S may be a flat surface. The benefit of the side surface 1372 which includes the stop surface 1372S is that in a specific application, if a force suffered by the second circuit board 140 in said application is known in advance, a planar stop surface 1372S facing a direction of the suffered force may be provided according to said direction. Generally, the planar stop surface 1372S is more capable of resisting a force normal to the planar stop surface 1372S than the arc surface or the cylindrical surface. Therefore, the second circuit board 140, peripheral parts, and the circuit layout can be further protected from damage in specific applications. The present disclosure certainly does not exclude embodiments in which the second shaft 137 only includes the cylindrical surface.

Reference is made to FIG. 8A and FIG. 8B. FIG. 8A is a schematic stereogram of a second fixing element 130A according to some embodiments of the present disclosure. FIG. 8B is a schematic stereogram of the second fixing element 130A according to some embodiments of the present disclosure. An angle of view in FIG. 8B is a rotation of 180 degrees along Y axis as compared to that of an angle of view in FIG. 8A. The second fixing element 130A in FIGS. 8A and 8B can be regarded as one variation of the second fixing element 130. In some embodiments, multiple second shafts 137A are provided, which can increase a contact area between the second fixing element 130 and the second circuit board 140 when the surface mounted structure is formed, so as to enhance the structural strength. In the embodiments as shown in FIG. 8B, the second shaft 137A is on a surface of the connecting portion 1334 of the accommodating portion 133 away from the groove portion 131 and is connected with the connecting portion 1334. Connection positions of the second shafts 137A to the accommodating portion 133 are on an area of outer edge of the second fixing element 130A, so that the circuit layout of the second circuit board 140 can be more flexible, and the freedom of layout is improved. Compared with the embodiments illustrated by FIGS. 7A and 7B, there is no base 135 provided in the embodiments as illustrated by FIGS. 8A and 8B. In some embodiments, omitting the base 135 can achieve an effect of reducing a board pitch (measured in Z direction) between the first circuit board 120 and the second circuit board 140.

Figure 10:
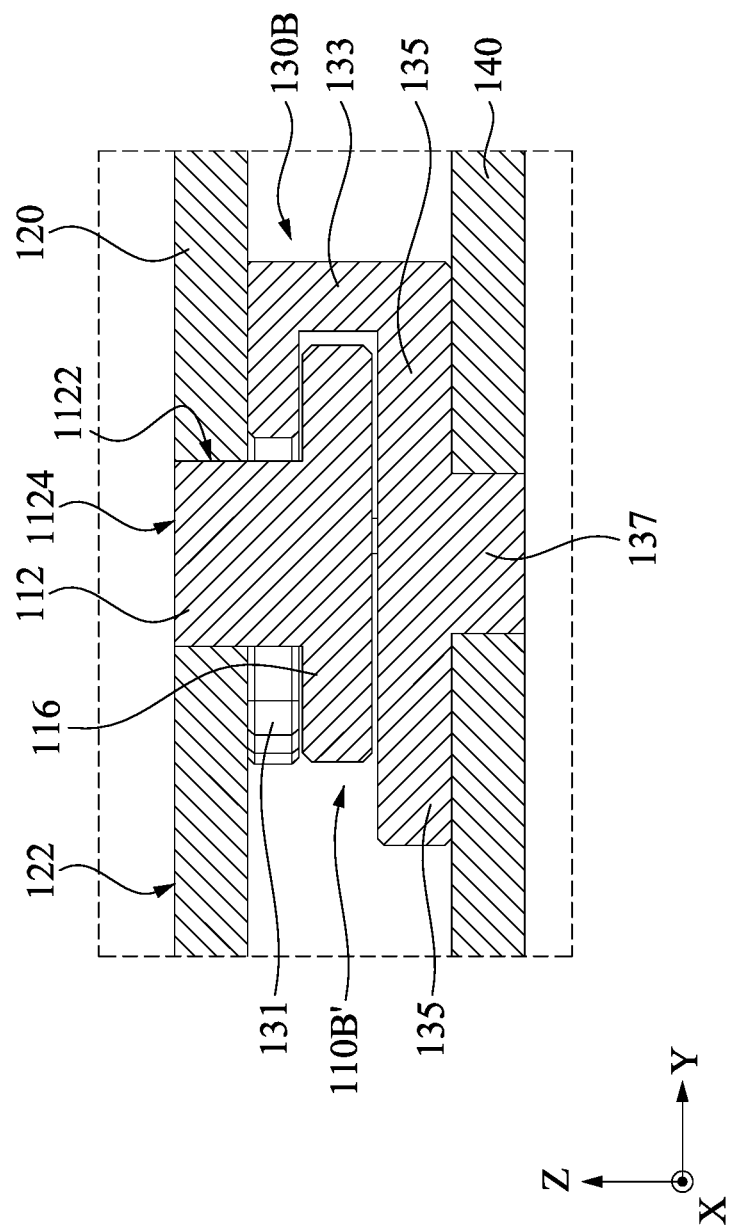
FIG. 10 is a schematic cross-sectional view of a structural element fixing structure according to some embodiments of the present disclosure.

Reference is made to FIG. 9A, FIG. 9B, and FIG. 10. FIG. 9A is a schematic stereogram of a second fixing element 130B according to some embodiments of the present disclosure. FIG. 9B is a schematic stereogram of the second fixing element 130B according to some embodiments of the present disclosure. An angle of view in FIG. 9B is a rotation of 180 degrees along Y axis as compared to that of an angle of view in FIG. 9A. The second fixing element 130B in FIGS. 9A and 9B can be regarded as one variation of the second fixing element 130. FIG. 10 is a schematic cross-sectional view of a structural element fixing structure 200 according to some embodiments of the present disclosure, which substantially uses the second fixing element 130B as shown in FIGS. 9A and 9B.

Compared with the embodiments as illustrated by FIGS. 7A and 7B, there is no alignment portion 139 provided in the embodiments as illustrated by FIGS. 9A and 9B. The structural element fixing structure 200 as achieved in this configuration is that the first circuit board 120 is directly in surface contact with the solid portion of the groove portion 131. In the embodiments as illustrated by FIG. 10, there is only a three-layer structure between the first circuit board 120 and the second circuit board 140 in Z direction, which includes the groove portion 131 (and/or a portion of the first shaft 112), the accommodating portion 133 (and/or the second flange 116), and the base 135. Compared with a four-layer structure between the first circuit board 120 and the second circuit board 140 in Z direction as illustrated by FIG. 1, the structural element fixing structure 200 as shown in FIG. 10 can achieve an effect of reducing the board pitch (measured in Z direction) between the first circuit board 120 and the second circuit board 140. The four-layer structure includes the first flange 114 (and/or the alignment portion 139 which is coplanar with the first flange 114 in an extension direction on X-Y plane), the groove portion 131, the second flange 116 (and/or the accommodating portion 133 which is coplanar with the second flange 116 in an extension direction on X-Y plane), and the base 135.

In the embodiments as illustrated by FIG. 10, there is no first flange 114 provided in the first fixing element 110B' as compared to the embodiments illustrated by FIG. 1, so as to match the structure of the second fixing element 130B. More specifically, the second flange 116 of the first fixing element 110B' is at one end of the first shaft 112 and is connected with the side surface 1122 of the first shaft 112. The first circuit board 120 is fixed to another end 1124 of the first shaft 112 and is spaced apart from the second flange 116. The second fixing element 130B clamps the second flange 116 of the first fixing element 110B'. A portion of the second fixing element 130B is between the second flange 116 and the first circuit board 120 and is in contact with the first circuit board 120. In some embodiments, the portion as mentioned is the groove portion 131. The recessed space 1312 of the groove portion 131 is configured to accommodate the first shaft 112. The second circuit board 140 is fixed on the base 135 and the second shaft 137 of the second fixing element 130B. The second fixing element 130B separates the second circuit board 140 from the first fixing element 110B'.

The embodiments as illustrated by FIG. 10 can be used, for example, in cases that a narrow board pitch (e.g., about 3 µm) is presented between the first circuit board 120 and the second circuit board 140 measured in Z direction, but should not be limited thereto. The embodiments as illustrated by FIG. 1 can be used, for example, in cases that a normal board pitch (e.g., about 6 µm) is presented between the first circuit board 120 and the second circuit board 140 measured in Z direction, but should not be limited thereto.

In summary, the structural element fixing structure provided by the embodiments of the present disclosure can omit or greatly reduce the formation of holes on the circuit board. The need of forming gourd-shaped holes on the circuit board in order to fix two adjacent circuit boards in the existing technologies is improved. In addition, in the embodiment of the present disclosure, the fixing elements are only set on one side respectively of two adjacent circuit boards, which improves the shortcomings on the sacrifice of the circuit layout and deficient space for setting parts. Said shortcomings are resulted from that opposite surfaces of the circuit board are both fixed to the first fixing element in the existing technologies.

In one embodiment of the present disclosure, a server of the present disclosure may be applied to computing and edge computing of artificial intelligence (AI), and may also be used as a 5G server, a cloud server, or a server for internet of vehicles.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A structural element fixing structure, comprising:
    a first fixing element, comprising:
        a first shaft; and
        a flange connected with a side surface of the first shaft;
    a first structural element fixed on the first fixing element;
    a second fixing element clamping the flange, the second fixing element comprising:
        a groove portion;
        an accommodating portion laterally connected with the groove portion, the accommodating portion having an accommodating space under the groove portion, the accommodating space being configured to accommodate the flange; and
        a second shaft connected with the accommodating portion and under the accommodating portion; and
    a second structural element fixed to and under the second shaft of the second fixing element, and the second fixing element separating the second structural element from the first fixing element,
    wherein the second structural element is a circuit board, the accommodating portion extends from a base of the second fixing element to the groove portion, the second shaft passes through the base, and a portion of the second shaft extends from the base toward the second structural element and forms a surface mounted structure with the second structural element,
    wherein the first fixing element further comprises another flange connected with the side surface of the first shaft and spaced apart from the flange, the groove portion has a recessed space configured to accommodate a portion of the first shaft between the flange and the another flange, and the second fixing element further comprises an alignment portion on the groove portion and configured to abut against the first structural element.

2. The structural element fixing structure of claim 1, wherein the second fixing element further comprises another second shaft.

3. A structural element fixing structure, comprising:
    a first fixing element, comprising:
        a first shaft;
        a first flange connected with a side surface of the first shaft; and
        a second flange connected with the side surface of the first shaft and spaced apart from the first flange;
    a first structural element fixed on the first fixing element;
    a second fixing element, comprising:
        a groove portion, the first flange and the second flange clamping the groove portion, the groove portion having a recessed space configured to accommodate a portion of the first shaft between the first flange and the second flange;
        an accommodating portion laterally connected with the groove portion, the accommodating portion having an accommodating space under the groove portion, the accommodating space being configured to accommodate the second flange; and
        a second shaft connected with and under the accommodating portion; and
    a second structural element fixed under the second shaft of the second fixing element, the second fixing element separating the second structural element from the first fixing element, and the second structural element being a circuit board.

4. The structural element fixing structure of claim 3, wherein the accommodating portion extends from a base of the second fixing element to the groove portion, the second shaft passes through the base, a portion of the second shaft extends from the base toward the second structural element, and at least a portion of the accommodating portion and the second shaft form a surface mounted structure with the second structural element.

5. The structural element fixing structure of claim 3, wherein the second fixing element further comprises another second shaft.

* * * * *